(12) United States Patent
Adelmann et al.

(10) Patent No.: US 10,749,106 B2
(45) Date of Patent: Aug. 18, 2020

(54) MAGNETIC RANDOM ACCESS MEMORY DEVICE HAVING MAGNETIC TUNNEL JUNCTION

(71) Applicant: IMEC VZW, Leuven (BE)

(72) Inventors: Hanns Christoph Adelmann, Wilsele (BE); Gouri Sankar Kar, Leuven (BE); Johan Swerts, Kessel-Lo (BE); Sebastien Couet, Grez-Doiceau (BE)

(73) Assignee: IMEC vzw, Leuven (BE)

( * ) Notice: Subject to any disclaimer, the term of this patent is extended or adjusted under 35 U.S.C. 154(b) by 0 days.

(21) Appl. No.: 15/801,213

(22) Filed: Nov. 1, 2017

(65) Prior Publication Data
US 2018/0123031 A1 May 3, 2018

(30) Foreign Application Priority Data
Nov. 2, 2016 (EP) ..................................... 16196888

(51) Int. Cl.
*H01L 29/82* (2006.01)
*H01L 43/12* (2006.01)
*H01L 43/10* (2006.01)
*G11C 11/14* (2006.01)
*H01L 27/22* (2006.01)
*H01L 43/02* (2006.01)
*H01L 43/08* (2006.01)

(52) U.S. Cl.
CPC ............ *H01L 43/12* (2013.01); *H01L 27/228* (2013.01); *H01L 43/02* (2013.01); *H01L 43/08* (2013.01); *H01L 27/222* (2013.01)

(58) Field of Classification Search
CPC ..... H01L 27/228; H01L 43/08; G11C 11/161; G11C 11/1673; G11C 11/1675
See application file for complete search history.

(56) References Cited

U.S. PATENT DOCUMENTS

| | | | |
|---|---|---|---|
| 2003/0193758 A1* | 10/2003 | Hiramoto | B82Y 10/00 360/321 |
| 2004/0063223 A1* | 4/2004 | Costrini | H01L 43/12 438/3 |
| 2006/0087880 A1* | 4/2006 | Mancoff | G11C 11/1659 365/158 |
| 2009/0246557 A1 | 10/2009 | Horng et al. | |
| 2010/0074092 A1 | 3/2010 | Zhu et al. | |
| 2014/0169088 A1* | 6/2014 | Buhrman | G11C 11/18 365/158 |

(Continued)

OTHER PUBLICATIONS

Extended European Search Report dated May 16, 2017; European Application No. 16196888.8 in 8 pages.

*Primary Examiner* — Brian Turner
(74) *Attorney, Agent, or Firm* — Knobbe, Martens, Olson & Bear, LLP

(57) ABSTRACT

The disclosed technology generally relates to semiconductor devices and more particularly to semiconductor devices comprising a magnetic tunnel junction (MTJ). In an aspect, a method of forming a magnetoresistive random access memory (MRAM) includes forming a layer stack above a substrate, where the layer stack includes a ferromagnetic reference layer, a tunnel barrier layer and a ferromagnetic free layer and a spin-orbit-torque (SOT)-generating layer. The method additionally includes, subsequent to forming the layer stack, patterning the layer stack to form a MTJ pillar.

20 Claims, 3 Drawing Sheets

(56) References Cited

U.S. PATENT DOCUMENTS

| | | | |
|---|---|---|---|
| 2014/0264513 A1* | 9/2014 | De Brosse | H01L 43/065 |
| | | | 257/295 |
| 2014/0264671 A1 | 9/2014 | Chepulskyy et al. | |
| 2014/0361390 A1 | 12/2014 | Hu | |
| 2016/0027999 A1* | 1/2016 | Pinarbasi | H01L 43/02 |
| | | | 438/3 |
| 2016/0225423 A1 | 8/2016 | Naik et al. | |
| 2017/0125078 A1* | 5/2017 | Mihajlovic | G11C 11/161 |
| 2017/0148848 A1* | 5/2017 | Ahn | H01L 43/10 |

\* cited by examiner

MAGNETIC RANDOM ACCESS MEMORY DEVICE HAVING MAGNETIC TUNNEL JUNCTION

CROSS-REFERENCE TO RELATED APPLICATIONS

This application claims foreign priority to European Patent Application No. 16196888.8, filed Nov. 2, 2016, the content of which is incorporated by reference herein in its entirety.

BACKGROUND

Field

The disclosed technology generally relates to semiconductor devices and more particularly to semiconductor devices comprising a magnetic tunnel junction (MTJ).

Description of the Related Technology

Magnetic random access memory technology is a promising memory technology as a complement or replacement for static random-access memories (SRAMs). A spin torque transfer MRAM (STT-MRAM) enables non-volatile storage of data in magnetic tunnel junctions (MTJs). An MTJ comprises a reference layer, a tunnel barrier layer and a free layer, wherein the relative magnetic orientation of the reference layer and the free layer determines an electric resistance of the MTJ. The states of an MRAM may include, e.g., a relatively low electrical resistance state in which the magnetization directions of the reference layer and the free layer are aligned in the same direction, e.g., parallel to each other, and a relatively high electrical resistance state in which the magnetization directions of the reference layer and the free layer are misaligned, e.g., anti-parallel to each other. In MRAMs including an MTJ, the magnetization direction of the reference layer may be fixed or pinned, and the reference layer is therefore sometimes referred to as a "pinned layer." On the other hand, the magnetization direction of the free layer may be varied by passing current, e.g., spin polarized current, through the MTJ.

One type of MRAM including an MTJ is spin-orbit-torque STT MRAM (SOT-STT MRAM). A schematic illustration of a typical prior art MTJ pillar 100 for an SOT-STT MRAM bit cell is shown in FIG. 1.

The MTJ pillar 100 includes in a top-down direction a reference layer 102, a tunnel barrier layer 104, a free layer 106 and an SOT-generating layer 108. Because the reference layer 102 is arranged above the free layer 106, the MTJ pillar 100 may sometimes be referred to as a "top-pinned" MTJ. The reference layer 102 and the SOT-generating layer 108 may be connected to a top electrode (not shown) and a bottom electrode (not shown), respectively. By conducting a current $I_{SOT}$ through the SOT-generating layer 108, a spin torque may be exerted on the free layer 106. By conducting both an SOT-generating current $I_{SOT}$ and an STT-generating current $I_{STT}$ through the MTJ 100 pillar, the magnetization of the free layer 106 may be switched, ideally faster and at lower total power than in an STT-only MTJ.

SUMMARY OF CERTAIN INVENTIVE ASPECTS

Although SOT-STT MRAMs shows promise performance-wise, how to scale fabrication of MTJs for SOT-STT MRAMs on full wafers with sufficient yield remains a challenge. An objective of the present inventive concept is to address this challenge. Additional or alternative objectives may be understood from the following.

According to a first aspect of the present inventive concept there is provided a method of forming a magnetic tunnel junction, MTJ, for a spin-orbit-torque spin-transfer-torque, SOT-STT, magnetoresistive random access memory, MRAM, the method comprising:
forming a layer stack above a substrate, the layer stack including in a bottom-up direction a reference layer, a tunnel barrier layer, a free layer and a SOT-generating layer, and
subsequent to forming the layer stack, patterning the layer stack to form a MTJ pillar.

The method according to the first aspect enables reliable fabrication of multiple MTJs for SOT-STT MRAM. Fabrication of the prior art "top-pinned" MTJ requires patterning of the layer stack to form the MTJ pillar including the reference layer, the tunnel barrier layer and the free layer, and stopping at the SOT-generating layer without over-etching. To generate a sufficient current density in the SOT-generating layer, the thickness of the SOT-generating layer should be small, typically on the order of only a few nm. Over-etching during the patterning of a top-pinned MTJ pillar will result in a reduced thickness of the SOT-generating layer. As realized by the inventors, fabrication of multiple MTJs, as in full-wafer scale fabrication, would result in a non-uniform thickness reduction of the SOT-generating layers of the MTJ pillars which in turn could lead to large and unacceptable variability in memory cell performance. In contrast, the inventive method enables forming of a plurality of "bottom-pinned" MTJs with improved uniformity in terms of both structure and memory performance.

The forming of the layer stack may include subjecting the reference layer, the tunnel barrier layer and the free layer to an annealing process (i.e. post-deposition) prior to forming the SOT-generating layer on the free layer. Thereby, the SOT-generating layer need not be subjected to the stress induced by the annealing process, which is typically done after MRAM stack fabrication. This contributes to obtaining a high-quality SOT-generating layer, a high-quality MTJ fabrication, and a high-quality interface between the free layer and the SOT-generating layer.

In the following, the terminology MTJ will be used to refer to the actual magnetic tunnel junction which provides the magnetic tunnel function whereas the terminology MTJ pillar will be used to refer to the pillar structure including (among others) the MTJ.

The "bottom-up direction" refers to the order of the layers in the stack in relation to the substrate. The terminology "bottom-up direction" does hence not refer to an absolute orientation of the layer stack or MTJ pillar but to a relative ordering or a sequence of the layers forming the MTJ pillar or a growth sequence of the layers of the stack.

The reference layer is a layer having a magnetization which is fixed or pinned. That is, the direction of the magnetization vectors or magnetic moments of the reference layer is fixed or pinned. The reference layer may also be referred to as the fixed layer or the pinned layer.

The tunnel barrier layer is arranged between the reference layer and the free layer. The tunnel barrier layer is a non-ferromagnetic and electrically insulating layer. The tunnel barrier layer is adapted to allow a tunneling current across the tunnel barrier layer.

The free layer is a layer having a magnetization which may be varied. That is, the direction of the magnetization vectors or magnetic moments of the free layer may be varied. The direction of the magnetization of the free layer may be varied between two states, a "parallel" state wherein the magnetization direction of the free layer is parallel to the magnetization direction of the reference layer and an "anti-parallel" state wherein the magnetization direction of the free layer is anti-parallel to the magnetization direction of the reference layer.

The SOT-generating layer is arranged on, preferably directly on, the free layer. The SOT-generating layer is formed such that a current may be conducted within the plane of extension of the SOT-generating layer, and consequently along or parallel to the free layer. The SOT-generating layer is formed by a material exhibiting a relatively large spin-orbit coupling such that when a current is conducted within the SOT-generating layer a torque is exerted on the magnetization or magnetic moments of the free layer.

By passing a sufficient current (i.e. STT-generating current $I_{STT}$) through the MTJ, the magnetization of the free layer may be switched between the parallel state and the anti-parallel state via spin-transfer-torque (STT).

By passing a sufficient current (i.e. SOT-generating current $I_{SOT}$) within the plane of extension of the SOT-generating layer, the magnetization of the free layer may be switched between the parallel state and the anti-parallel state via spin-orbit-torque (SOT).

By combining an STT-generating current and an SOT-generating current the combined torque exerted on the free layer via the SOT- and the STT-effect may switch the magnetization of the free layer faster and at a lower total power than by SOT or STT alone.

The tunnel magneto-resistance ratio (TMR) is a measure of the difference in the MTJ electrical resistance between the anti-parallel state and the parallel state of the magnetization of the free layer. The different states of the free layer, and accordingly the different resistance levels, may be used to represent either a logic "1" or a logic "0". A reading operation of the MTJ may be performed by measuring a resistance of the MTJ to a "read current" passed through the MTJ. A writing operation of the MTJ may be performed by changing or flipping the resistance level of the MTJs from the high-resistance state to the low-resistance state and vice versa by applying the SOT-generating current and the STT-generating current.

An SOT-STT MRAM, as used herein, refers to an MRAM wherein data may be stored in an MTJ or an array of MTJs, wherein the magnetization of the free layer of each MTJ may be switched between the parallel state and the anti-parallel state by an STT-generating current in combination with an SOT-generating current.

The reference layer may be a magnetic layer. The free layer may be a magnetic layer. By a "magnetic" layer is hereby meant a layer formed by a material having a net magnetization which is non-zero. A magnetic layer may be formed by a ferromagnetic layer. The tunnel barrier layer may be a dielectric layer. The SOT-generating layer may be formed by a metal layer or a layer of a topological insulator.

The layer stack may be formed on the substrate with one or more intermediate structures and/or layers present between the substrate and the bottom layer of the layer stack. The layer stack may be formed above a front end of line (FEOL) portion supported by the substrate. By FEOL-portion is hereby meant a portion including active devices, for instance semiconductor devices. The layer stack may for instance be formed above an interlayer dielectric formed above the FEOL portion. The layer stack may also be formed above or in an interlayer dielectric formed in a back end of line (BEOL) portion supported by the substrate. By BEOL-portion is hereby meant a structure of metallization layers including conductive patterns, interlayer dielectrics and optionally vias interconnecting conductive patterns of different metallization layers.

The act of patterning of the layer stack may include forming a mask above the layer stack and etching regions of the layer stack exposed by the mask, thereby forming one or more MTJ pillars.

The act of patterning of the layer stack includes patterning the layer stack to form at least two MTJ pillars, each MTJ pillar including a separate reference layer, a separate tunnel barrier layer, a separate free layer and a separate SOT-generating layer. Two or more MTJ pillars with substantially uniform properties may thereby be formed in a same process. This enables a rational manufacture of an array of MTJs on the substrate.

The method may further comprise forming a bottom electrode for contacting the reference layer. By an electrode "contacting" or "making contact with" a structure (e.g. a layer) is hereby meant that the electrode makes electrical/galvanic contact with the structure. The bottom electrode enables conduction of a current to the reference layer for conduction through the MTJ. Either a read current or an STT-generating current may be conducted via the bottom electrode. Since both a read current and an STT-generating current is conducted perpendicular to the MTJ, the bottom electrode may be formed to contact a bottom surface of the reference layer. The bottom electrode may be formed by a conductor, more specifically a conducting layer, a conducting line or a via, for instance in a BEOL-portion. The bottom electrode may be formed to contact a bit line or a word line. The bottom electrode may be formed to contact a source/drain terminal of a bit line transistor.

The method may further comprise forming a top electrode for contacting the SOT-generating layer. The top electrode enables conduction of a SOT-generating current to the SOT-generating layer for in-plane conduction through the SOT-generating layer. The SOT-generating layer may according to the method form a top layer of the MTJ pillar wherein contacting the top electrode with the SOT-generating layer is facilitated.

The top electrode may be formed on, preferably directly on, an upper surface of the SOT-generating layer.

If more than one MTJ pillar has been formed a top electrode for contacting the SOT-generating layer of each MTJ pillar may be formed. A top electrode may be formed on an upper surface of the SOT-generating layer of each one of said at least two MTJ pillars.

The top electrode may be formed on an upper surface of the SOT-generating layer and be adapted to present a higher resistance than the SOT-generating layer along a portion of the top electrode extending directly above (and along) the upper surface of the SOT-generating layer. Thereby, a conduction path of lowest total resistance between a current input portion and a current output portion of the top electrode may extend via the SOT-generating layer (more specifically via/through a portion of the SOT-generating layer arranged directly below a top electrode portion between the current input portion and the current output portion).

The top electrode may be formed on an upper surface of the SOT-generating layer and include a first top electrode portion and a second top electrode portion, said first and second portions being separated by a distance. A top electrode with a gap directly above the SOT-generating layer may thus be formed. The first top electrode portion may form a current input portion and the second top electrode portion may form a current output portion.

By virtue of the gap, a bias applied between the first and second top electrode portions may result in a conduction path from the first top electrode portion to the second top electrode portion via the SOT-generating layer. More specifically the current path may extend via/through a portion of the SOT-generating layer arranged directly below the gap.

The top electrode may be formed on an upper surface of the SOT-generating layer and include first, second and third top electrode portions, the first and second portions being separated by the third portion and the third portion presenting a resistance such that a conduction path of lowest total resistance between the first electrode portion and the second electrode portion extends via the SOT-generating layer (more specifically via a portion of the SOT-generating layer arranged directly below the third electrode portion).

The third portion may be formed by a material having a higher resistance than the in-plane resistance of the SOT-generating layer. The third portion may present a higher resistance than the first and the second electrode portions. The third portion may be formed by a dielectric material.

The layer stack may be formed to further include a sacrificial layer on the SOT-generating layer, and the method may further comprise, subsequent to the patterning of the layer stack, removing the (patterned) sacrificial layer. The sacrificial layer may protect the SOT-generating layer during the patterning process, for instance from etchants used for forming the pillar. The sacrificial layer may be of a material which may be removed in a selective manner from the SOT-generating layer, for instance by selective etching. The top electrode may be formed after the sacrificial layer has been removed.

According to one embodiment the method comprises forming a mask above the layer stack, wherein patterning the layer stack includes removing portions of the layer stack exposed by the mask. Subsequent to the patterning, a dielectric planarization layer may be formed adjacent to the MTJ pillar such that an upper surface of the planarization layer becomes flush with an upper surface of the mask. Thereafter the mask may be removed to form an aperture exposing an upper surface of the patterned layer stack.

The dielectric planarization layer may be formed by depositing a dielectric material layer to cover the patterned layer stack and the mask and thereafter reducing a thickness of the dielectric material layer until an upper surface of the mask is exposed.

The upper surface exposed by the aperture may be an upper surface of the SOT-generating layer or an upper surface of the sacrificial layer, if such a layer is present. If a sacrificial layer is present the sacrificial layer may be removed after the mask has been removed.

The aperture allows a top electrode to be formed on the SOT-generating layer to be conveniently and reliably aligned with the MTJ pillar.

Accordingly, subsequent to removing the mask, the top electrode may be formed on the upper surface of the SOT-generating layer. The top electrode may be formed in any of the manners described above.

According to a second aspect of the present inventive concept there is provided an SOT-STT MRAM device comprising:
an MTJ pillar arranged above a substrate and including a patterned layer stack including in a bottom-up direction a reference layer, a tunnel barrier layer, a free layer and an SOT-generating layer.

In line with the above discussion with respect to the first aspect, the MRAM device (or shorter MRAM) of the second aspect includes a bottom-pinned MTJ pillar having a structure allowing reliable fabrication of an MRAM with data storage elements based on MTJs with uniform structure and memory performance. As further discussed above a high-quality SOT-generating layer, a high-quality MTJ, and a high quality interface between the free layer and the SOT-generating layer may be obtained. The further discussion of advantages and details in connection with the first aspect applies correspondingly to the second aspect and will therefore not be repeated here.

The device may comprise an array of MTJ pillars, each MTJ pillar including a separate reference layer, a separate tunnel barrier layer, a separate free layer and a separate SOT-generating layer. The device may include a plurality of MTJ pillars arranged aligned in columns and rows.

The device may comprise a bottom electrode arranged to contact the reference layer of the MTJ pillar (or each MTJ pillar of an array). The bottom electrode may be adapted to conduct a read current or STT-generating current to the reference layer for conduction through the MTJ.

A separate bottom electrode may be arranged to contact the reference layer of each MTJ pillar of an array of MTJ pillars. This enables selective reading and writing of data from/to each MTJ.

The device may comprise a top electrode arranged to contact the SOT-generating layer of the MTJ pillar (or the SOT-generating layer of each MTJ pillar of an array). The top electrode may be adapted to conduct an SOT-generating current to the SOT-generating layer.

A separate top electrode may be arranged to contact the SOT-generating layer of each MTJ pillar of an array of MTJ pillars. This enables selective writing of data from/to each MTJ.

The top electrode may be formed on, preferably directly on, an upper surface of the SOT-generating layer of the MTJ pillar (or of each MTJ pillar of an array).

The top electrode may be arranged on an upper surface of the SOT-generating layer and be adapted to present a higher resistance than the SOT-generating layer along a portion of the top electrode extending directly above (and along) the upper surface of the SOT-generating layer. Thereby, a conduction path of lowest total resistance between a current input portion and a current output portion of the top electrode may extend via the SOT-generating layer (more specifically via/through a portion of the SOT-generating layer arranged directly below an intermediate top electrode portion between the current input portion and the current output portion).

The top electrode may include a first top electrode portion and a second top electrode portion separated by a distance. The first top electrode portion may form a current input portion and the second top electrode portion may form a current output portion. The distance or separation may be formed directly above the SOT-generating layer.

The top electrode may include a first top electrode portion, a second top electrode portion, and a third top electrode portion, wherein the first and the second portions are separated by the third portion, the third portion presenting a higher resistance than the first and the second top electrode portions. The third portion may be formed directly above the SOT-generating layer.

BRIEF DESCRIPTION OF THE DRAWINGS

The above, as well as additional objects, features and advantages of the present inventive concept, will be better understood through the following illustrative and non-limiting detailed description of preferred embodiments of the present inventive concept, with reference to the appended drawings. In the drawings like reference numerals will be used for like elements unless stated otherwise.

DETAILED DESCRIPTION OF CERTAIN ILLUSTRATIVE EMBODIMENTS

A method of fabricating an magnetic random access memory (MRAM) device comprising a magnetic tunneling junction (MTJ), e.g., an spin-orbit-torque spin-torque-transfer (SOT-STT) MRAM, will now be described with reference to FIG. 2a through 2d, in which stacked intermediate structures are shown at different stages of fabrication, according to embodiments. In each of FIGS. 2a-2d, the intermediate structure is shown in a cross-sectional view. It should be noted that the layers may extend laterally/horizontally beyond the illustrated portions. It should also be noted that for the purpose of clarity, the various layers and other features of the stacks are not drawn to scale and their relative dimensions, in particular their thickness, may differ from a physical stack.

Figure 1:
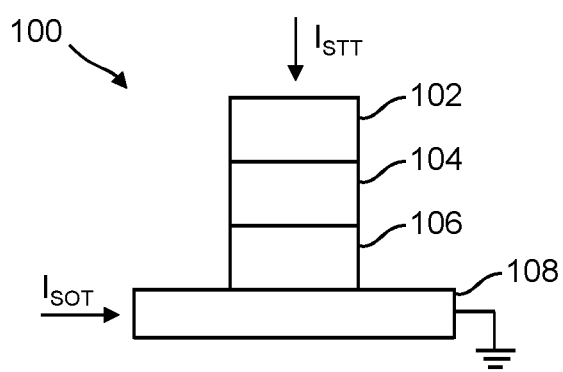
FIG. 1 is a schematic view of a prior art MTJ pillar.
Figure 2A:
FIG. 2a through 2d schematically illustrate a process for forming an MRAM device comprising an MTJ, according to embodiments.

FIG. 2a shows an intermediate structure of an MRAM device comprising a MTJ, including a stack of layers 202-208 formed above a substrate 201, according to embodiments. The substrate 201 may be a semiconductor substrate. Examples of semiconductor substrates include a Si substrate, a Ge substrate, a SiGe substrate, a SiC substrate, a SOI substrate, a GeOI substrate, a SiGeOI substrate to name a few.

In a bottom-up direction from the substrate 201, the layer stack includes a reference layer 202, a tunnel barrier layer 204, a free layer 206 and an SOT-generating layer 208.

The reference layer 202 has a magnetization that is fixed in a particular direction whereas the magnetization of the free layer 15 may be altered by write currents as will be further described. The reference layer 202 may include a layer of a magnetic material. The reference layer 202 includes a layer of a ferromagnetic material. Examples of materials for the reference layer 202 include, e.g., Fe, Co, CoFe, FeB, CoB, CoFeB, and/or mixtures, combinations or alloys thereof. The reference layer 202 may also have a multi-layer structure including combinations of the aforementioned materials.

The reference layer 202 may have a perpendicular magnetic anisotropy (PMA). As described herein PMA refers to magnetic anisotropy in a layer normal direction or in a direction that is perpendicular to a major surface of the reference layer 202. The reference layer 202 may be formed on a pinning layer (not shown) that is fixing or pinning the magnetization direction of the reference layer 202. The pinning layer may be a synthetic antiferromagnet (SAF). The pinning may be achieved via ferromagnetic exchange coupling through a spacer layer with a hard magnetic layer. The spacer may include, e.g., Ta, W, Mo, CoFeBTa, CoFeBW, CoBTa, FeBTa, CoBW, FeBW, FeTa, CoTa, FeW, TaW, or combinations thereof. In some cases, pinning may be achieved by coupling the reference layer 202 through a spacer layer to a Co/Ru/hard magnetic layer pinning system. The hard magnetic layer may include a combination of a Co-layer and a Pt-layer, a combination of a Co-layer and a Ni-layer, a combination of a Co-layer and a Pd-layer, MnGe alloys, MnGa alloys, CoPt alloys, CoNi alloys, FePt alloys, or any combination thereof. The hard magnetic layer is typically grown on a seed layer that acts as a texturing layer to provide the needed texture to induce a perpendicular magnetic anisotropy. The seed layer may be formed by an antiferromagnetic material in order to fix the magnetization of the hard magnetic layer or the SAF.

The free layer 206 may include a layer of a ferromagnetic material. Examples of ferromagnetic materials for the free layer include Fe, Co, FeB, CoB, CoFe, CoFeB, and mixtures, combinations or alloys thereof. The free layer 206 may include a multi-layer structure including combinations of the aforementioned materials. In some embodiments, the free layer 206 may, in a similar manner to the reference layer 202, have a PMA.

The tunnel barrier layer 204 may include a thin layer of a dielectric material, for instance MgO, $AlO_x$, MgAlOx or MgTiOx and be adapted to allow charge carriers, e.g., electrons, to tunnel between the reference layer 202 and the free layer 206. The tunnel barrier layer 204 may be less than a few nm, e.g., less than 3 nm, less than 2 nm, less than 1 nm, or in a range defined by any of these values, such that sufficient tunneling current can pass therethrough at less than a few volts, e.g., less than about 3V, 2V, 1V or in a range defined by any of these values. The reference layer 202, the tunnel barrier layer 204 and the free layer 206 form an MTJ.

By way of example, a CoFeB reference layer 202, an MgO tunnel barrier layer 204 and a CoFeB free layer 206 may be deposited in the layer stack as amorphous layers by physical vapor deposition or sputtering. The reference layer 202 and the free layer 206 may subsequently be crystallized by annealing at a temperature of at least 250° C. During the annealing the MgO tunnel barrier layer 204 may act as a template and transfer its texture to the reference layer 202 and the free layer 206. The deposition and annealing processes are as such in various embodiments described throughout the specification, and will therefore not be further described.

The SOT-generating layer or SOT-layer 208 (hereinafter referred to as the SOT-layer 208) may include a layer of an electrically conducting material presenting a relatively large spin-orbit coupling. In various embodiments, the SOT-layer 208 may be formed of or include a non-magnetic material. Example materials for the SOT-layer 208 include metals such as, e.g. Ta, W, Pt, Ir, IrMn, PtMn, WOx, or combinations thereof, or topologic insulators such as $Bi_2Se_3$. The SOT-layer 208 may also have a multi-layer structure including for instance a combination of any of the above-mentioned materials and an additional antiferromagnetic layer formed between the aforementioned conducting material and the free layer 206. The SOT-layer 208 may be formed with a thickness of 10 nm or less, 5 nm or less, or between 5 nm and 10 nm. The SOT-layer 208 may be formed using conventional deposition techniques such as evaporation or sputtering. If the free layer 206 is subjected to an annealing process, the SOT-layer 208 may be deposited thereafter to avoid exposing the SOT-layer 208 to the elevated temperatures during the annealing process.

As shown, the layer stack may be formed above a front end-of-the-line (FEOL) portion 203 and a back end-of-the line (BEOL) portion 205. The FEOL-portion 203 may include active devices formed in a semiconductor layer of the substrate 201. The devices may be configured as logic circuit devices. The devices may include switches used for reading and writing of the MTJs which are to be formed. The devices included in the FEOL portion 203 may include, for instance, MOSFETs, MISFETs, BJTs, JBTs, FinFETs, nanowire FETs to name a few. The devices may be formed using conventional FEOL-processing.

The BEOL-portion 205 may include a number of metallization layers separated by interlayer dielectrics. An interlayer dielectric may also be formed on top of the FEOL-portion 203 for insulating the devices from the lower level metallization layer. Metallization layers may for instance be formed by Cu, W, Au, Ag, Al, Co or Ru. Interlayer dielectrics may for instance be formed by silicon oxide, silicon oxide nitride, silicon carbide nitride or silicon nitride. The BEOL-portion 205 may include vias interconnecting metallization layers. Vias may for instance be formed by Cu, W, Au, Ag, Al, Co, Ni, Ru or by a highly doped semiconductor material. One or more of the metallization layers may define bit lines and word lines for the array of the memory cells which are to be formed. The metallization layers may together with the active devices of the FEOL-portion 203 define logic circuitry for controlling reading and writing operations and for driving bit lines and word lines. The BEOL-portion may be formed using conventional BEOL-processing.

Figure 2B:
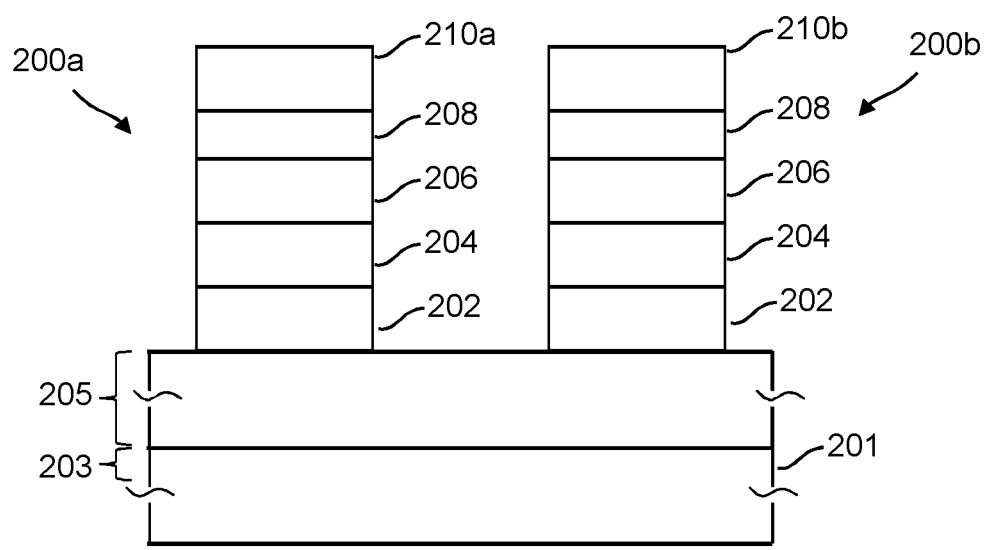

In FIG. 2b, the layer stack has been patterned to form a first and a second MTJ pillar 200a, 200b, each including an MTJ. It should be noted that in practice a plurality of further MTJ pillars may be simultaneously formed outside the portion illustrated in FIG. 2b.

A mask including mask portions 210a, 210b may be formed above the layer stack. The mask may be formed by silicon oxide, silicon oxide nitride, silicon carbide nitride or silicon nitride The mask may be a hard mask. Examples of hard mask materials include TiN, TaN, TiTaN and spin-on-carbon/spin-on-glass materials. A mask layer may be deposited above the layer stack. The mask portions 210a, 210b may be defined by patterning a photo resist formed on the mask layer and transferring the pattern of the photo resist to the mask layer by etching. The mask portions 210a, 210b may for instance be patterned to a rectangular shape, an oval shape or a circular shape, as viewed in a top-down direction.

The pattern of the mask may subsequently be transferred to the layer stack by etching regions of the layer stack which are exposed by the mask portions 210a, 201b. The layer stack may be patterned using in an anisotropic etch process such as a reactive-ion-etching (RIE) process or an ion-beam-etching (IBE) process. The layer stack may be etched until the pattern has been completely transferred to the lowermost layer of the MTJ pillars 200a, 200b (which in FIG. 2b is formed by the reference layer 202). Pinning layers, seed layers etc. which as described above may be present below the reference layer 202 may be patterned together with the above layers of the stack.

Figure 2C:
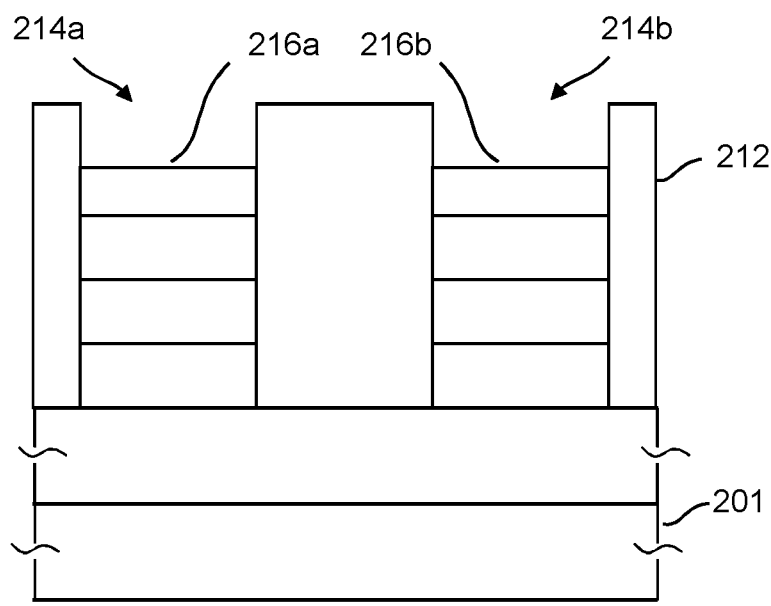

In FIG. 2c, a dielectric planarization layer 212 has been formed above the substrate 201 and the mask portions 210a, 210b have been removed to form apertures 214a, 214b above the MTJ pillars 210a, 210b. The apertures 214a, 214b expose the respective top surfaces 216a, 216b of the SOT-layer 208 of the MTJ pillars 200a, 200b.

The dielectric planarization layer 212 may be formed by depositing a dielectric material layer (such as a silicon oxide), e.g., a blanket dielectric material layer, to cover the MTJ pillars 210a, 210b and the mask portions 210a, 210b. A thickness of the dielectric material layer may thereafter be reduced until an upper surface thereof becomes flush or coplanar with the upper surfaces of the mask portions 210a, 210b. The thickness reduction may be achieved by etch-back and/or chemical mechanical planarization (CMP) of the dielectric material layer. The exposed mask portions 210a, 210b may subsequently be stripped from the MTJ pillars 200a, 200b. Apertures 214a, 214b may thus be formed in a self-aligned manner with respect to the MTJ pillars 200a, 200b. The mask portions 210a, 210b may be stripped by a selective etching process such that the mask portions 210a, 210b are selectively removed from the MTJ pillars 200a, 200b without any appreciable etching of the SOT-layers 208. Examples of etching processes include reactive ion etching (RIE) as well as wet etching.

Figure 2D:
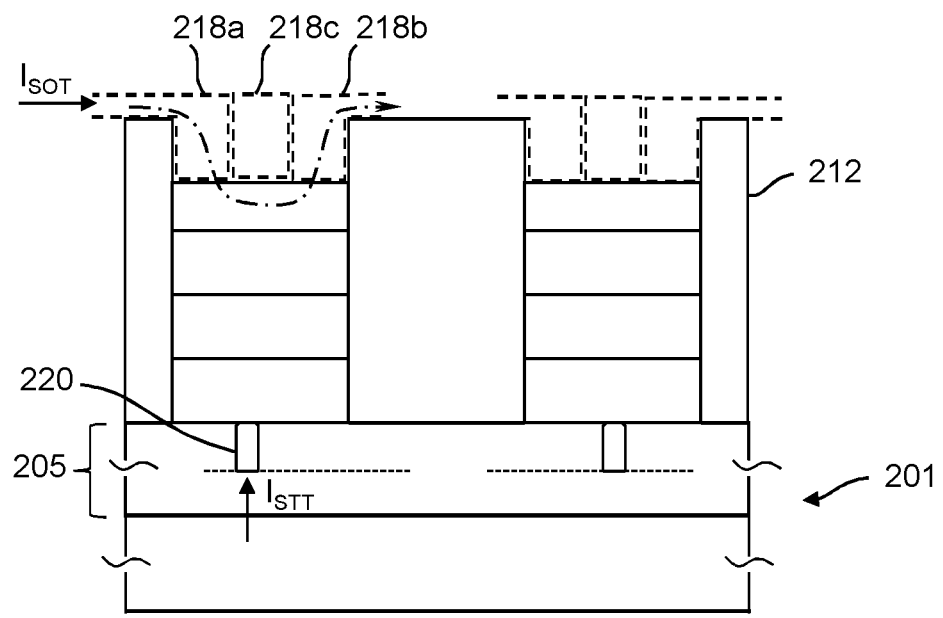

In FIG. 2d, a top electrode including first, second and third electrode portions 218a, 218b, 218c have been formed on the respective SOT-layer 208 of the MTJ pillars 200a, 200b. As shown, the third portion 218c is laterally interposed between the first and the second portions 218a, 218b. The third portion 218c is formed of a material presenting a resistance such that the conduction path (represented by the dashed-dotted arrow in FIG. 2d) of lowest total resistance between the first electrode portion 218a (forming a current input portion) and the second electrode portion 218b (forming a current output portion) extends via the SOT-layer 208 (more specifically via a portion of the SOT-generating layer arranged directly below the third electrode portion 218c). The third portion 218c may be formed by a material having a higher resistance than the portion of the SOT-layer 208 directly below the third electrode portion 218c. The third electrode portion 218c may be formed by a dielectric material. The third electrode portion 218c may also be formed by a conductor or semiconductor having a resistance greater than a resistance of the SOT-layer 208 such that the SOT-current $I_{SOT}$ may be conducted through the SOT-layer 208.

Each top electrode may be formed by deposition of a conducting material layer on top of the MTJ pillars 200a, 200b. Respective electrodes for each MTJ pillar 200a, 200b may be patterned wherein undesired portions of the deposited conducting material layer may be removed by etching. Thereafter, a portion of the conducting material layer may be removed by patterning the electrodes to form a gap at a position, e.g., at a position between adjacent dielectric planarization layers 212, for the third electrode portion 218c. The gap may separate the electrode into a first portion 218a and a second portion 218b. A material for forming the third electrode portion 218c may thereafter be deposited to fill the gap between the first portion 218a and the second portion 218b. Material deposited outside the gap may be removed from the structure, e.g., by CMP.

Although in the illustrated embodiment of FIG. 2d, the third electrode portion 218c covers only a portion of the top surfaces 216a, 216b of the SOT-layers of the MTJ pillars 200a, 200b, embodiments are not so limited. In other embodiments, the top electrode may also be formed such that the third electrode portion 218c covers the entire top surface 216a, 216b of the SOT-layers of the respective MTJ pillars 200a, 200b. This may simplify alignment with the MTJ pillars 200a, 200b and thus facilitate forming of the top electrodes. By forming the third portion 218c of a material presenting the above-described resistance properties, the SOT-current $I_{SOT}$ may be conducted through the SOT-layer 208. In this configuration, the material forming the third electrode portion 218c may be formed first. First and second electrode portions 218a, 218b may then be formed adjacent to and on opposite sides of the third electrode portion 218c.

In any case, the first and second electrode portions 218a, 218b may be formed by a material presenting a higher conductance than the third electrode portion 218c, according to some embodiments. A total resistance of the top electrode may thereby be reduced. Other embodiments are possible. For example, the first, second and third portions 218a-c may also be formed of the same material and form a continuous electrode top electrode. The terminology first, second and third "portions" need thus not refer to discrete electrode portions but may refer to portions of a continuous material or structure forming the top electrode.

In some other embodiments, in the top electrode, the third electrode portion 218c may be an air gap. A similar resulting conduction path may thereby be obtained between the first and second electrode portions 218a, 218b. Such a top electrode may be formed by subsequent to deposition of a conducting material on top of the MTJ pillars 200a, 200b and etching off a portion of the conducting material directly above the SOT-generating layers 208 to form the gaps.

Following forming of the top electrode, further interlayer dielectrics and metallization layers may be deposited above the MTJ pillars 200a, 200b. The further metallization layer may, e.g., define bit lines or word lines for addressing individual MTJs of the array. The first top electrode portion 218a and the second top electrode portion 218b may be connected to the bit lines or word lines by a respective via formed in the interlayer dielectric.

As further illustrated in FIG. 2d, a bottom electrode 220 may be formed to contact the reference layer 202. The bottom electrode 220 may be comprise a via interconnecting the reference layer 202 with a metal line (represented schematically by the dashed line in FIG. 2d) in a metallization layer of the BEOL-portion 205. The metal line may form a bit line or word line, for example. If the MTJ pillar 200a includes layers below the reference layer 202 (such as a seed layer) the bottom electrode 202 may contact the reference layer 202 by way of the layers underlying the reference layer 202. A bottom electrode 202 in the form of a via may be formed in the BEOL-portion 205 prior to forming of the layer stack.

As an alternative to a via, a bottom electrode 220 may be formed by a metal line (forming e.g. bit line or a word line) of a metallization layer of the BEOL-portion 205. The MTJ pillar 200a may be formed directly on top of the metal line bottom electrode 220. The MTJ pillar 200a may also be formed to include a bottom electrode 220 in the form of an electrode layer, below the reference layer 202. The electrode layer may be formed by a metal. The electrode layer may present an in-plane extension exceeding the in-plane extension of the reference layer 202. The electrode layer may be co-extensive with the reference layer 202. The electrode layer may in turn be formed directly on a metal line of the BEOL-portion or be connected to a metal line of the BEOL-portion by means of a via.

With reference to FIG. 2d, a writing operation of the MTJ 200a may be performed by changing or flipping the resistance level of the MTJs from the high-resistance state to the low-resistance state and vice versa by conducting the SOT-generating current pulse $I_{SOT}$ through the SOT-layer 208 and an STT-generating current pulse $I_{STT}$. Without being bound to any theory, $I_{SOT}$ may, by an SOT-effect, exert a spin torque on the magnetic moments in the free layer 206. $I_{SOT}$ may be spin-polarized by the reference layer 202 and also exert a torque on the magnetic moments in the free layer 206 by means of the STT-effect. The combined torques exerted on the MTJ 200a by the $I_{SOT}$ through the SOT-layer 208 and by the $I_{STT}$, when sufficient, induce a switching of the MTJ 200a between the high- and low-resistance states. Thus, the MTJ is configured such that a spin torque is exerted on the free layer 206 when current flows through the SOT-layer 208, and further configured such that the ferromagnetic reference layer 202 exerts a further spin torque on the free layer 206 when electrons tunnel from the reference layer 202 to the free layer 206 through the tunnel barrier layer 204. A reading operation of the MTJ pillar 200a may be performed by passing a read current through the MTJ pillar 200a and measuring the resistance of the MTJ 200a to the read current.

In the above the inventive concept has mainly been described with reference to a limited number of examples. However, as is readily appreciated by a person skilled in the art, other examples than the ones disclosed above are equally possible within the scope of the inventive concept, as defined by the appended claims. For instance, although in the above a reference layer 202 and a free layer 206 with PMA was described it is contemplated that the process is applicable also to MTJs including a reference layer and a free layer presenting an in-plane magnetic anisotropy. The structure and function of such junctions is as such known in the art and is therefore not described in detail herein. In a variation relating to the stage of the process illustrated in FIG. 2c, it is also possible to remove the mask portions 210a, 210b prior to forming the dielectric planarization layer 212, although alignment of the top electrode and the MTJ pillars 200a, 200b then may become more challenging. Furthermore, in the above the mask layer and mask layer portions 210a, 210b served as a sacrificial layer of the layer stack which was removed following forming of the MTJ pillars 200a, 200b. However, in a variation of the above method a separate sacrificial layer may be formed on the SOT-layer 208 of the layer stack. The mask layer and mask layer portions 210a, 210b may thus be formed on this separate sacrificial layer rather than directly on the SOT-layer 208. The separate sacrificial layer may be stripped from the SOT-layer 208 of the MTJ pillars 200a, 200b prior to forming of the top electrodes. A separate sacrificial layer may be formed by a material which may be deposited on and stripped from the SOT-layer 208 using a process which is less aggressive with respect to the SOT-layer 208 than the process of depositing the mask layer and stripping the mask portions 210a, 210b. The separate sacrificial layer may include an amorphous carbon layer, a spin-on carbon layer, a spin-on-glass layer. A separate sacrificial layer may thus prevent the deposition and removal of the mask layer to adversely affect the SOT-layer 208.

What is claimed is:
1. A method of forming a magnetoresistive random access memory (MRAM) device, the method comprising:
   providing a substrate;
   forming a layer stack above the substrate, the layer stack including in a bottom-up direction a ferromagnetic reference layer, a tunnel barrier layer, a ferromagnetic free layer and a spin-orbit-torque (SOT)-generating layer configured to exert a spin torque on the ferromagnetic free layer when current flows therethrough in an in-plane direction of the SOT-generating layer;
   subsequent to forming the layer stack, patterning the layer stack to form a magnetic tunnel junction (MTJ) pillar; and
   forming a top electrode comprising a central electrode portion laterally interposed between adjacent electrode portions, the central electrode portion having a higher electrical resistance relative to the SOT-generating layer and the adjacent electrode portions such that the current flows through a path including the adjacent electrode portions and the SOT-generating layer, wherein the SOT-generating layer is a non-magnetic layer directly contacting each of the adjacent electrode portions.

2. The method according to claim 1, wherein forming the layer stack includes configuring the ferromagnetic reference layer to exert a further spin torque on the ferromagnetic free layer when electrons tunnel from the ferromagnetic reference layer to the ferroelectric free layer through the tunnel barrier layer.

3. The method according to claim 1, wherein patterning the layer stack includes forming a plurality of MTJ pillars, wherein each of the MTJ pillars includes a ferroelectric reference layer, a tunnel barrier layer, a ferroelectric free layer and a SOT-generating layer.

4. The method according to claim 3, wherein the SOT-generating layer comprises one or more of Ta, W, Pt, Ir, IrMn, PtMn, $WO_x$ and $Bi_2Se_3$.

5. The method according to claim 3, further comprising forming a bottom electrode contacting the ferroelectric reference layer of each of the MTJ pillars.

6. The method according to claim 5, further comprising forming a top electrode contacting the SOT-generating layer of each of the MTJ pillars.

7. The method according to claim 6, wherein the top electrode is configured such that the top electrode has an electrical resistance in a lateral direction along the central portion of the top electrode extending directly above an upper surface of the SOT-generating layer that is higher than an electrical resistance of a corresponding portion of the SOT-generating layer in the lateral direction.

8. The method according to claim 6, wherein the top electrode is formed directly on the SOT-generating layer and the adjacent electrode portions include a first top electrode portion and a second top electrode portion, wherein the first and second top electrode portions are laterally separated by a gap.

9. The method according to claim 1, wherein forming the layer stack comprises forming a sacrificial layer on the SOT-generating layer, the method further comprising, subsequent to patterning, removing the sacrificial layer.

10. The method according to claim 1, wherein patterning the layer stack includes removing portions of the layer stack exposed by a mask formed above the layer stack, the method further comprising, after patterning:
    forming a dielectric planarization layer adjacent to the MTJ pillar, the dielectric planarization layer having an upper surface that is about flush with an upper surface of the mask; and
    removing the mask to form an opening exposing an upper surface of the SOT-generating layer.

11. The method according to claim 10, further comprising forming a top electrode on the exposed upper surface the SOT-generating layer.

12. The method according to claim 1, wherein the SOT-generating layer is formed of an electrically conducting non-magnetic material.

13. A magnetoresistive random access memory (MRAM) device, comprising:
    a substrate;
    a magnetic tunnel junction (MTJ) pillar formed above the substrate, the MTJ pillar including in a bottom-up direction a ferromagnetic reference layer, a tunnel barrier layer, a ferromagnetic free layer and a spin-orbit-torque (SOT)-generating layer configured to exert a spin torque on the ferromagnetic free layer when current flows therethrough in an in-plane direction of the SOT-generating layer; and
    a top electrode comprising a central electrode portion laterally interposed between adjacent electrode portions, the central electrode portion having a higher electrical resistance relative to the SOT-generating layer and the adjacent electrode portions such that the current flows through a path including the adjacent electrode portions and the SOT-generating layer, wherein the SOT-generating layer is a non-magnetic layer directly contacting each of the adjacent electrode portions.

14. The MRAM device according to claim 13, wherein the SOT-generating layer comprises one or more of Ta, W, Pt, Ir, IrMn, PtMn, $WO_x$ and $Bi_2Se_3$.

15. The MRAM device according to claim 13, wherein the MTJ pillar is further configured such that the ferromagnetic reference layer exerts a further spin torque on the ferromagnetic free layer when electrons tunnel from the ferromagnetic reference layer to the ferromagnetic free layer through the tunnel barrier layer.

16. The MRAM device according to claim 13, further comprising an array of MTJ pillars including the MTJ pillar, wherein each of the array of MTJ pillars includes a ferromagnetic reference layer, a tunnel barrier layer, a ferromagnetic free layer and a SOT-generating layer.

17. The MRAM device according to claim 13, further comprising a bottom electrode directly contacting the reference layer of the MTJ pillar.

18. The MRAM device according to claim 13, wherein the top electrode is configured such that the top electrode has an electrical resistance in a lateral direction along the central portion of the top electrode extending directly above an upper surface of the SOT-generating layer that is higher than an electrical resistance of a corresponding portion of the SOT-generating layer in the lateral direction.

19. The MRAM device according to claim 18, wherein the top electrode is formed on an upper surface of the SOT-generating layer and the adjacent electrode portions include a first top electrode portion and a second top electrode portion separated by a gap.

20. The MRAM device according to claim 13, wherein the SOT-generating layer is formed of an electrically conducting non-magnetic material.

* * * * *